United States Patent
Kudo

(10) Patent No.: US 11,211,251 B2
(45) Date of Patent: Dec. 28, 2021

(54) METHOD OF MANUFACTURING SEMICONDUCTOR DEVICE

(71) Applicant: Mitsubishi Electric Corporation, Tokyo (JP)

(72) Inventor: Tomohito Kudo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/766,003

(22) PCT Filed: Feb. 2, 2018

(86) PCT No.: PCT/JP2018/003518
§ 371 (c)(1),
(2) Date: May 21, 2020

(87) PCT Pub. No.: WO2019/150541
PCT Pub. Date: Aug. 8, 2019

(65) Prior Publication Data
US 2020/0279744 A1 Sep. 3, 2020

(51) Int. Cl.
| | |
|---|---|
| *H01L 29/423* | (2006.01) |
| *H01L 21/28* | (2006.01) |
| *H01L 21/285* | (2006.01) |

(52) U.S. Cl.
CPC .... *H01L 21/28114* (2013.01); *H01L 21/2855* (2013.01); *H01L 29/4236* (2013.01)

(58) Field of Classification Search
CPC .......... H01L 21/28114; H01L 21/2855; H01L 29/4236; H01L 29/417; H01L 21/28
See application file for complete search history.

(56) References Cited

U.S. PATENT DOCUMENTS 6,140,678 A * 10/2000 Grabowski ......... H01L 27/0255
257/328
9,496,384 B2 * 11/2016 Nakano ............. H01L 29/41766
(Continued)

FOREIGN PATENT DOCUMENTS

JP 2005079462 A 3/2005
JP 2006-066474 A 3/2006
(Continued)

OTHER PUBLICATIONS

International Search Report issued in PCT/JP2018/003518; dated Apr. 3, 2018.
(Continued)

*Primary Examiner* — David Vu
(74) *Attorney, Agent, or Firm* — Studebaker & Brackett PC

(57) ABSTRACT

An object of the present invention is to improve the flatness of a surface electrode without increasing the number of steps in a semiconductor device having gate structures. A method of manufacturing a semiconductor device of the present invention includes the steps of discretely forming a plurality of gate structures on a first main surface of the semiconductor substrate, discretely forming a plurality of gate interlayer films covering the plurality of gate structures of the semiconductor substrate, forming a first surface electrode being thicker than the gate interlayer films on the first main surface of the semiconductor substrate between the plurality of the gate interlayer films and on the plurality of the gate interlayer films by sputtering, and removing convex portions of concave portions and the convex portions on the first surface electrode by dry etching using photolithography, to flatten an upper surface of the first surface electrode.

7 Claims, 4 Drawing Sheets

(56) References Cited

U.S. PATENT DOCUMENTS

| 2010/0197127 A1 | 8/2010 | Urano |
| 2010/0323499 A1 | 12/2010 | Takahashi et al. |
| 2017/0179108 A1 | 6/2017 | Okuda et al. |
| 2019/0198607 A1 | 6/2019 | Hamada et al. |

FOREIGN PATENT DOCUMENTS

| JP | 2009224756 A | 10/2009 |
| JP | 2010-182807 A | 8/2010 |
| JP | 2011003726 A | 1/2011 |
| JP | 2013098228 A | 5/2013 |
| JP | 2015088738 A | 5/2015 |
| JP | 2017147433 A | 8/2017 |
| WO | 2018/016208 A1 | 1/2018 |

OTHER PUBLICATIONS

An Office Action; "Notice of Reasons for Refusal", mailed by the Japanese Patent Office dated Jan. 5, 2021, which corresponds to Japanese Patent Application No. 2019-568511 and is related to U.S. Appl. No. 16/766,003; with English language translation.

\* cited by examiner

METHOD OF MANUFACTURING SEMICONDUCTOR DEVICE

TECHNICAL FIELD

The present invention relates to a method of manufacturing a semiconductor device.

BACKGROUND ART

In a semiconductor device having gate structures, an interlayer insulating film is formed on a semiconductor substrate and covers the gate structure. As a structure for eliminating a step due to the interlayer insulating film, there is a structure in which a tungsten electrode having a height substantially equal to that of the interlayer insulating film is formed between the interlayer insulating films (hereinafter, referred to as a "plug structure"). With the plug structure, the flatness of the surface electrode formed on the interlayer insulating film is secured, and the reliability of the semiconductor device is improved.

Various other structures have been conventionally proposed for flattening a surface electrode of a semiconductor device having a trench gate electrode (for example, Patent Documents 1 and 2).

PRIOR ART DOCUMENTS

Patent Documents

[Patent Document 1] Japanese Patent Application Laid-Open No. 2013-98228
[Patent Document 2] Japanese Patent Application Laid-Open No. 2011-3726

SUMMARY

Problem to be Solved by the Invention

In the method of Patent Document 1, the opening portion of the interlayer insulating film reaches directly above the trench gate; therefore, in addition to the necessity that the interlayer insulating film is thickened, strict control of the taper angle of the opening portion of the interlayer insulating film has been required. Further, there has been a problem of the insufficient flatness of the surface electrode.

Further, in the method of Patent Document 2, there has been a problem that, the film forming step, the reflow step, and the etching step need to be repeated a plurality of times in order to eliminate a step on the surface electrode, and accordingly, the number of steps increases.

Also, in the case of adopting a plug structure, there has been a problem that the steps of forming a barrier metal and a tungsten plug is required to be added, and the number of steps increases.

The present invention has been made in order to solve the above problems, and has as an object to improve the flatness of a surface electrode without increasing the number of steps in a semiconductor device having gate structures.

Means to Solve the Problem

According to the present invention, a first method of manufacturing a semiconductor device includes the steps of discretely forming a plurality of gate structures on a first main surface of the semiconductor substrate, discretely forming a plurality of gate interlayer films covering the plurality of gate structures of the semiconductor substrate, forming a first surface electrode being thicker than a plurality of gate interlayer films on the first main surface of the semiconductor substrate between the plurality of the gate interlayer films and on the plurality of the gate interlayer films by sputtering, and removing convex portions of concave portions and the convex portions on the first surface electrode generated due to steps between the gate interlayer films and the first main surface of the semiconductor substrate by dry etching using photolithography, to flatten an upper surface of the first surface electrode.

According to the present invention, a second method of manufacturing a semiconductor device includes the steps of discretely forming a plurality of gate structures on a first main surface of the semiconductor substrate, discretely forming a plurality of gate interlayer films covering the plurality of gate structures of the semiconductor substrate, forming a first surface electrode being thinner than a plurality of gate interlayer films on the first main surface of the semiconductor substrate between the plurality of the gate interlayer films and on the plurality of the gate interlayer films, and forming a second surface electrode on an upper surface of the first surface electrode by plating treatment.

Effects of the Invention

According to the first method of manufacturing the semiconductor device of the present invention, the upper surface of the first surface electrode is flattened by one sputtering and one dry etching. In addition, a plug structure is not employed; therefore, a step of forming a tungsten plug and a barrier metal is unnecessary. Accordingly, the surface electrode can be flattened with a small number of steps.

According to the second method of manufacturing the semiconductor device of the present invention, the flattening treatment of the first surface electrode is omitted; therefore, the number of steps can be further reduced as compared with the first method of manufacturing the semiconductor device of the present invention. Further, the height of the steps on the upper surface of the second surface electrode can be suppressed to be equal to or less than the thickness of the gate interlayer films, the surface electrode can be flattened according to the thickness of the gate interlayer films.

These and other objects, features, aspects and advantages of the present invention will become more apparent from the following detailed description of the present invention when taken in conjunction with the accompanying drawings.

DESCRIPTION OF EMBODIMENTS

A. Embodiment 1

<A-1. Configuration>

Figure 1:
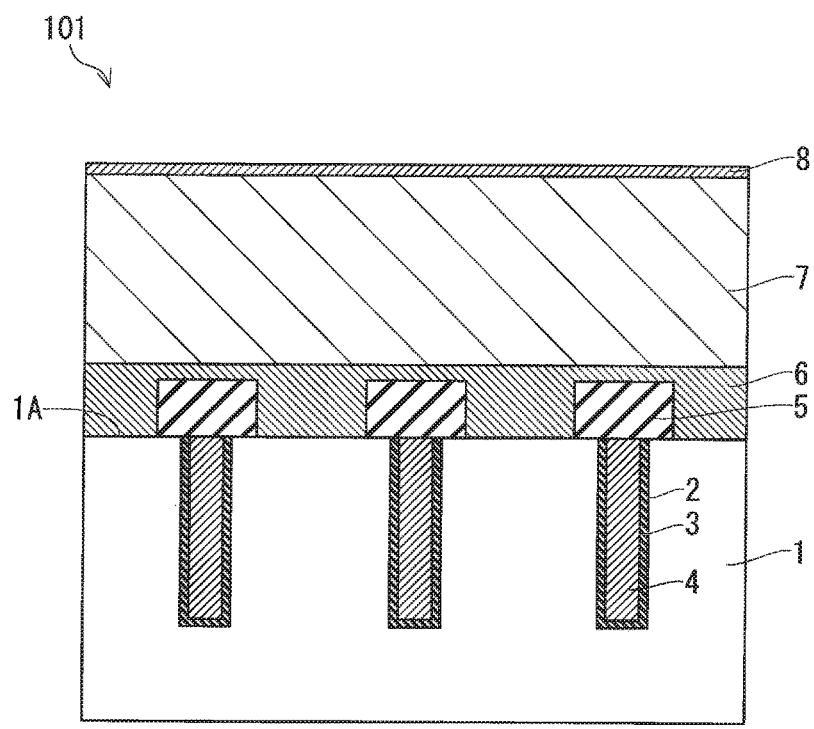
FIG. 1 A cross-sectional view illustrating a configuration of a semiconductor device according to Embodiment 1.

FIG. 1 is a configuration diagram of a semiconductor device 101 according to Embodiment 1. The semiconductor device 101 includes a semiconductor substrate 1, gate insulating films 3, gate electrodes 4, gate interlayer films 5, a first surface electrode 6, a second surface electrode 7, and a third surface electrode 8. That is, the surface electrode of the semiconductor device 101 has a three-layer structure of the first surface electrode 6, the second surface electrode 7, and the third surface electrode 8.

A plurality of trenches 2 (see FIG. 2) are formed in a first main surface 1A of the semiconductor substrate 1. A gate insulating film 3 is formed on the inner wall surface of each trench 2. Further a gate electrode 4 is formed inside each trench 2 on which the gate insulating film 3 is formed. In the present specification, the gate insulating film 3 and the gate electrode 4 are collectively referred to as a "gate structure".

On the first main surface 1A of the semiconductor substrate 1, the gate interlayer films 5 covering the gate electrodes 4 is formed. A plurality of gate interlayer films 5 are discretely provided on the first main surface 1A of the semiconductor substrate 1 such that the gate interlayer films 5 correspond to respective gate electrodes 4. Accordingly, steps are formed between the upper surface of the gate interlayer film 5 and the first main surface 1A of the semiconductor substrate 1.

On the first main surface 1A of the semiconductor substrate 1 between the gate interlayer films 5 and on the gate interlayer films 5, a first surface electrode 6 is formed. The material of the first surface electrode 6 is an Al-based material containing Al, for example, AlSi.

On the upper surface of the first surface electrode 6, the second surface electrode 7 is formed. The material of the second surface electrode 7 is an Ni-based material containing Ni, for example, NiP. The second surface electrode 7 is formed by plating treatment.

On the upper surface of the second surface electrode 7, the third surface electrode 8 is formed. The material of the third surface electrode 8 is Au.

<A-2. Manufacturing Method>

Figure 2:
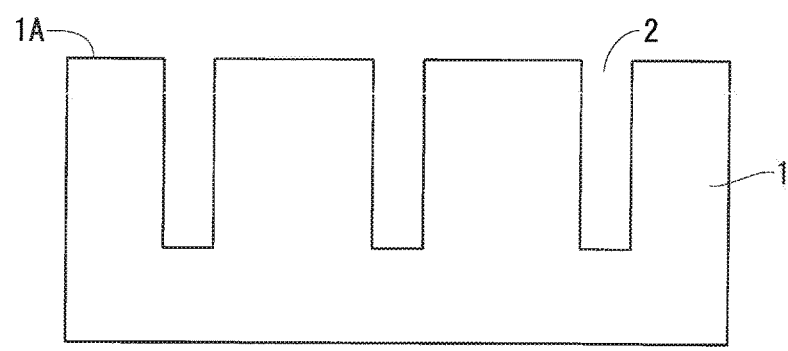
FIG. 2 A cross-sectional view illustrating a manufacturing process of the semiconductor device according to Embodiment 1.
Figure 3:
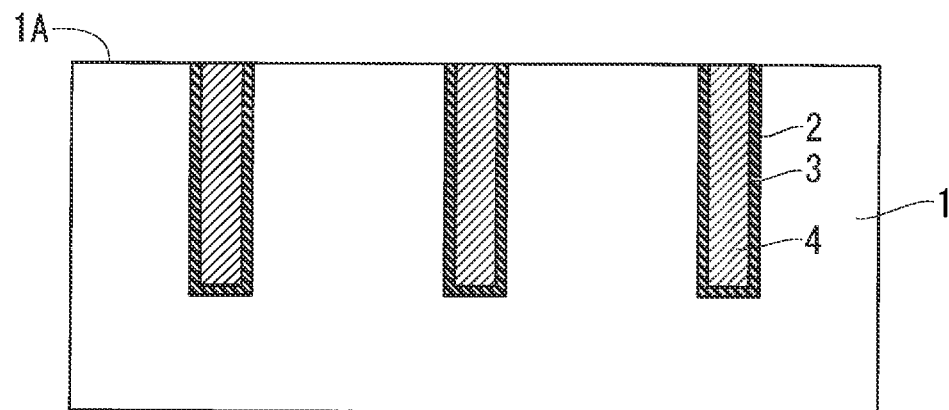
FIG. 3 A cross-sectional view illustrating the manufacturing process of the semiconductor device according to Embodiment 1.

Hereinafter, the method of manufacturing the semiconductor device 101 will be described. First, as illustrated in FIG. 2, a plurality of trenches 2 are formed on the first main surface 1A of the semiconductor substrate 1. Thereafter, the gate insulating film 3 is formed on the inner wall surface of each trench 2, that is, on the side surface and the bottom surface of each trench 2. Further, as illustrated in FIG. 3, the gate electrode 4 is formed inside each trench 2. Thus, a plurality of gate structures are formed in the semiconductor substrate 1.

Figure 4:
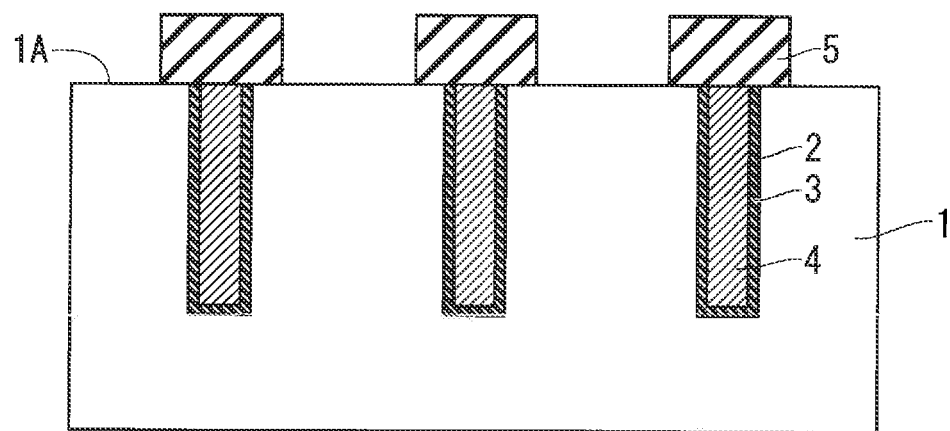
FIG. 4 A cross-sectional view illustrating the manufacturing process of the semiconductor device according to Embodiment 1.

Next, as illustrated in FIG. 4, the gate interlayer films 5 covering the gate electrodes 4 are formed on the first main surface 1A of the semiconductor substrate 1. The gate interlayer film 5 is not formed on the entire surface of the first main surface 1A of the semiconductor substrate 1, but a plurality of gate interlayer films 5 are formed discretely corresponding to the plurality of gate electrodes 4.

Figure 5:
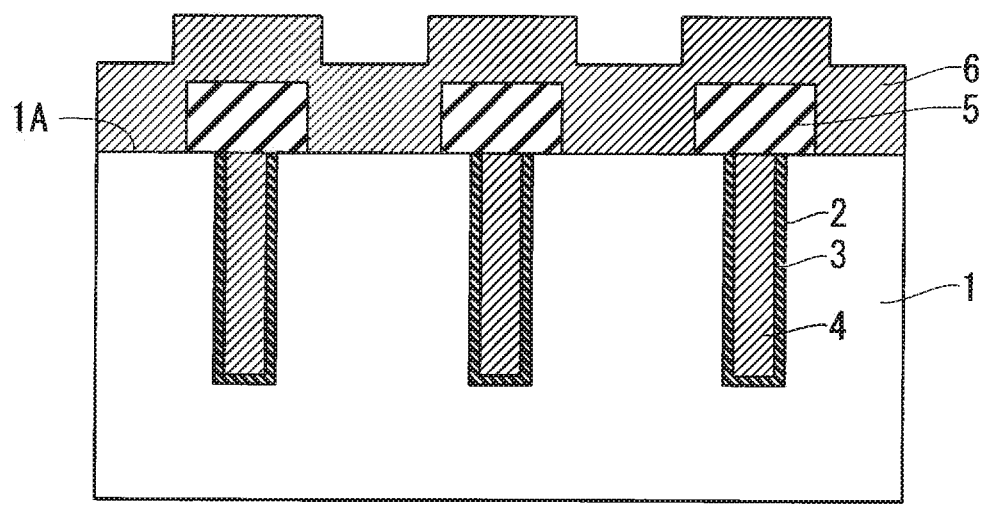
FIG. 5 A cross-sectional view illustrating the manufacturing process of the semiconductor device according to Embodiment 1.

Next, the first main surface 1A of the semiconductor substrate 1 is subject to known long throw sputtering (LTS), to form, as illustrated in FIG. 5, the first surface electrode 6 having a thickness not less than the gate interlayer film 5 on and between the gate interlayer films 5. LTS is a sputtering method in which a distance between a target and a wafer is set longer than that of when using general sputtering. In general sputtering, assuming that the distance between the target and the wafer is, for example, 54 mm, inLTS, the distance is 170 mm, for example, which is more than double of 54 mm. In LTS, the sputter discharge pressure is set lower than that of when using general sputtering. In general sputtering, assuming that the sputter discharge pressure is, for example, 0.26 Pa, and in LTS, the sputter discharge pressure is 0.06 Pa, for example, which is half or less of 0.26 Pa. Here, LTS is used in order to securely form the first surface electrode 6 between the gate interlayer films 5. By LTS, the movement direction of the sputtered particles reaching the semiconductor substrate 1 are brought to close to a direction perpendicular to the first main surface 1A; therefore, the first surface electrode 6 can be reliably formed, not only on the gate interlayer films 5, but also between the gate interlayer films 5.

Figure 6:
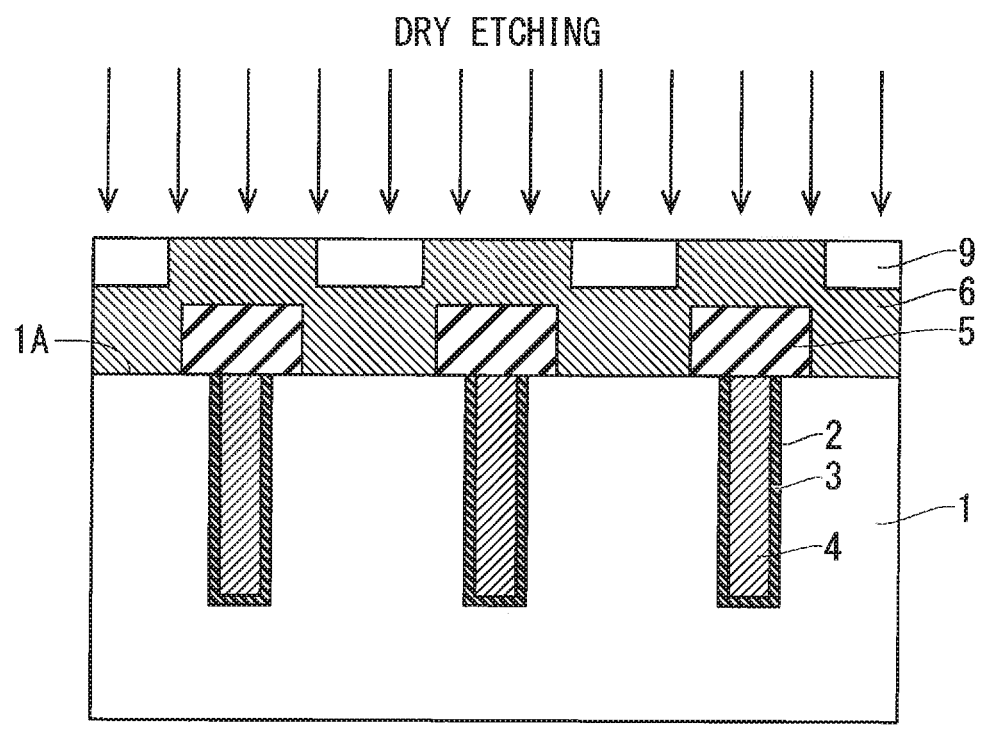
FIG. 6 A cross-sectional view illustrating the manufacturing process of the semiconductor device according to Embodiment 1.

Then, the first surface electrode 6 on the gate interlayer films 5 is selectively removed. As a method therefor, dry etching using photolithography is to be adopted. When the first surface electrode 6 is formed by the above-described sputtering, on the upper surface of the first surface electrode 6, steps are formed between portions above the gate interlayer films 5 and portions between the gate interlayer films 5, due to the steps between the upper surfaces of the gate interlayer films 5 and the first main surface 1A of the semiconductor substrate 1. As illustrated in FIG. 6, protective materials 9 such as resists are selectively formed in the concave portions of the steps on the upper surface of the first surface electrode 6, and convex portions of the steps on the upper surface of the first surface electrode 6 where the protective materials 9 are not formed are selectively removed by dry etching, to flatten the upper surface of the first surface electrode 6.

In particular, when the first surface electrode 6 is formed by LTS, steps appear more remarkably on the upper surface of the first surface electrode 6 than that of when using general sputtering. Therefore, the protective materials 9 can be formed in the concave portions with high precision, and as a result, the first surface electrode 6 can be flattened with high precision.

Next, the Ni-based second surface electrode 7 containing Ni is formed on the first surface electrode 6 by plating treatment. Finally, the third surface electrode 8 consisting of Au is formed on the second surface electrode 7 by plating treatment. Thus, the semiconductor device 101 illustrated in FIG. 1 is obtained.

<A-3. Effect>

As described above, the method of manufacturing the semiconductor device 101 discretely forms a plurality of gate structures on the first main surface 1A of the semiconductor substrate 1, discretely forms a plurality of gate interlayer films 5 covering a plurality of the gate structures of the semiconductor substrate 1, forms the first surface electrode 6 which is thicker than a gate interlayer film 5 on the first main surface 1A of the semiconductor substrate 1 between a plurality of the gate interlayer films 5 and on a plurality of the gate interlayer films 5 by sputtering, and removes the convex portions of the concave portions and convex portions on the first surface electrode 6 generated due to the steps between the gate interlayer films 5 and the first main surface 1A of the semiconductor substrate 1 by dry etching using photolithography, to flatten the upper surface of the first surface electrode 6. Thus, the upper surface of the first surface electrode 6 can be flattened by one sputtering and one dry etching. In addition, a plug structure is not employed; therefore, a step of forming a tungsten plug and a barrier metal is unnecessary. Accordingly, the surface electrode can be flattened with a small number of steps.

In the above description, the material of the first surface electrode 6 is an Al-based material. Al is suitable for the material of the first surface electrode 6 because of its easiness of processing and low electric resistance. However, the material of the first surface electrode 6 may be Ni. In the case where the material of the first surface electrode 6 is an Al-based material, a process of replacing Al contained in the first surface electrode 6 with Ni has been necessary in the plating treatment for forming the second surface electrode 7. However, when the material of the first surface electrode 6 is Ni, the above-described replacement process is not required, and the number of steps can be reduced.

Further, the material of the first surface electrode 6 may be Cu, and the material of the second surface electrode 7 may be Cu based containing Cu. Also in this case, the above-described replacement process is not required in the plating treatment when forming the second surface electrode 7, so that the number of steps can be reduced. Further, Cu has a lower electric resistance than Al, the on-resistance can be further reduced.

B. Embodiment 2

<B-1. Configuration>

Figure 7:
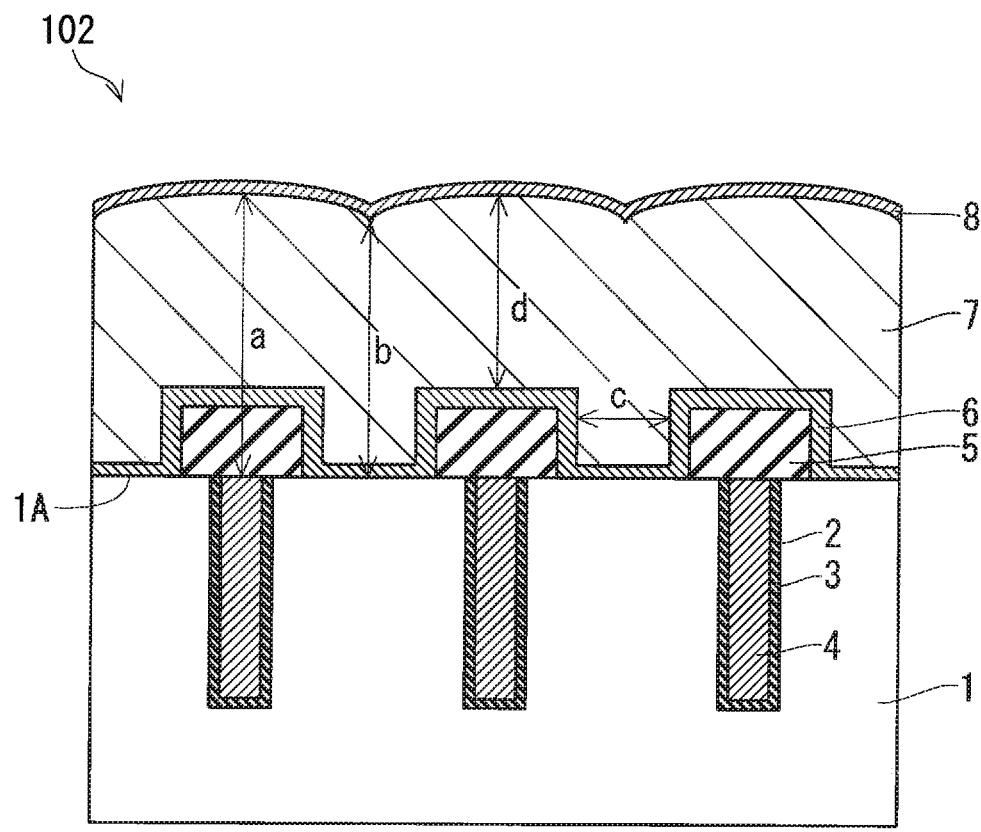
FIG. 7 A cross-sectional view illustrating a configuration of a semiconductor device according to Embodiment 2.

FIG. 7 is a configuration diagram of a semiconductor device 102 according to Embodiment 2. The semiconductor device 102 includes a semiconductor substrate 1, gate insulating films 3, gate electrodes 4, gate interlayer films 5, a first surface electrode 6, a second surface electrode 7, and a third surface electrode 8.

In the semiconductor device 102, the configuration of the first surface electrode 6 is different from that of the semiconductor device 101. While the first surface electrode 6 is formed thicker than the gate interlayer films 5 in the semiconductor device 101, the first surface electrode 6 is formed thinner than the gate interlayer films 5 in the semiconductor device 102.

<B-2. Manufacturing Method>

Figure 8:
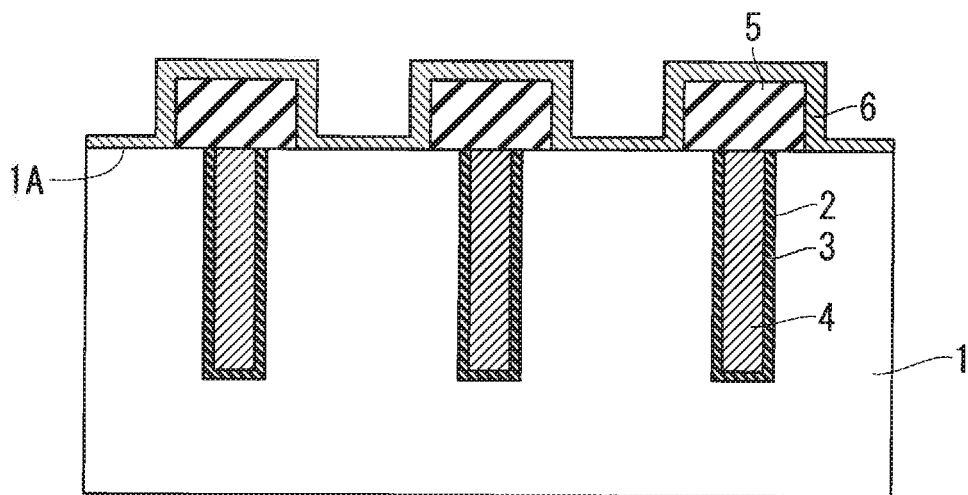
FIG. 8 A cross-sectional view illustrating a manufacturing process of the semiconductor device according to Embodiment 2.

Hereinafter, the method of manufacturing the semiconductor device 102 will be described. In the method of manufacturing the semiconductor device 102, the steps up to the step of forming the gate interlayer films 5 are the same as those in Embodiment 1. As illustrated in FIG. 8, the first surface electrode 6 is formed on the gate interlayer films 5 and between the gate interlayer films 5. Unlike Embodiment 1, the first surface electrode 6 is formed thinner than the gate interlayer films 5. As a method for forming the first surface electrode 6, for example, sputtering can be used. In particular, long throw sputtering ensures to form the first surface electrode 6, not only on the gate interlayer films 5, but also between the gate interlayer films 5. The reason why the first surface electrode 6 is formed thinner than the gate interlayer films 5 is that flattening treatment of the first surface electrode 6 is not performed in Embodiment 2.

Next, the Ni-based second surface electrode 7 containing Ni is formed on the first surface electrode 6 by plating treatment. At this time, steps due to the steps between the gate interlayer films 5 and the first main surface 1A of the semiconductor substrate 1 are formed on the upper surface of the first surface electrode 6. However, by utilizing the substitution reaction caused by the plating treatment, the second surface electrode 7 can be formed with a uniform film thickness from the surface of the first surface electrode 6; therefore, the second surface electrode 7 can also be formed on the first surface electrode 6 between the gate interlayer films 5. Further, the second surface electrode 7 is formed with a uniform thickness from the surface of the first surface electrode 6; therefore, the steps on the upper surface of the second surface electrode 7 do not become larger than the steps on the upper surface of the first surface electrode 6. That is, as illustrated in FIG. 7, "(a−b)≤the thickness of gate interlayer film 5" is satisfied, where a represents the distance from the upper surface of the second surface electrode 7 above the gate interlayer film 5 to the first main surface 1A of the semiconductor substrate 1, b represents the distance from the upper surface of the second surface electrode 7 above a portion between the gate interlayer films 5 to the first main surface 1A of the semiconductor substrate 1. For example, if the thickness of the gate interlayer film 5 is 2 μm or less, the height of the step on the second surface electrode 7 is 2 μm or less, and sufficient flatness can be obtained. As plating grows isotropically, in order to embed the second surface electrode 7 between the gate interlayer films 5, d which is the distance from the upper surface of the second surface electrode 7 above the gate interlayer film 5 to the first surface electrode 6 is necessary to be equal to or greater than ½ of c which is the distance between the gate interlayer films 5. Further, as d increases, the step on the upper surface of the second surface electrode 7 increases in flatness: therefore, d is desirably 1.5 μm or more.

Finally, the third surface electrode 8 consisting of Au is formed on the second surface electrode 7 by plating treatment. Thus, the semiconductor device 101 illustrated in FIG. 7 is obtained.

<B-3. Effect>

The method of manufacturing the semiconductor device 102 of Embodiment 2 discretely forms a plurality of gate structures on the first main surface 1A of the semiconductor substrate 1, discretely forms a plurality of gate interlayer films 5 covering a plurality of the gate structures of the semiconductor substrate 1, and forms the first surface electrode 6 which is thinner than a plurality of gate interlayer films 5 on the first main surface 1A of the semiconductor substrate 1 between a plurality of the gate interlayer films 5 and on a plurality of the gate interlayer films 5, to form the second surface electrode 7 on the upper surface of the first surface electrode 6 by the plating treatment. According to the manufacturing method, the flattening treatment of the first surface electrode 6 can be omitted. Then, the first surface electrode 6 does not need to be formed thicker than the gate interlayer film 5, and the first surface electrode 6 can be made thinner.

Note that, as in Embodiment 1, the material of the first surface electrode 6 may be an Al-based or Ni-based material. Further, the material of the first surface electrode 6 may be Cu, and the material of the second surface electrode 7 may be Cu based material. The advantages of each material are as described in Embodiment 1.

It should be noted that Embodiments of the present invention can be arbitrarily combined and can be appropriately modified or omitted without departing from the scope of the invention.

While the invention has been described in detail, the forgoing description is in all aspects illustrative and not restrictive. It is understood that numerous other modifications and variations can be devised without departing from the scope of the invention.

EXPLANATION OF REFERENCE SIGNS 1 semiconductor substrate, 1A first main surface, 2 trench, 3 gate insulating film, 4 gate electrode, 5 gate interlayer film, 6 first surface electrode, 7 second surface electrode, 8 third surface electrode, 9 protective material, 101, 102 semiconductor device.

The invention claimed is:

1. A method of manufacturing a semiconductor device, comprising the steps of:
    discretely forming a plurality of gate structures on a first main surface of a semiconductor substrate;
    discretely forming a plurality of gate interlayer films covering the plurality of gate structures of the semiconductor substrate;
    forming a first surface electrode being thicker than the gate interlayer films on the first main surface of the semiconductor substrate between the plurality of the gate interlayer films and on the plurality of the gate interlayer films by sputtering; and
    removing convex portions of concave portions and the convex portions on the first surface electrode generated due to steps between the gate interlayer films and the first main surface of the semiconductor substrate by dry etching using photolithography, to flatten an upper surface of the first surface electrode.

2. The method of manufacturing the semiconductor device according to claim 1, wherein
    the sputtering includes long throw sputtering.

3. The method of manufacturing the semiconductor device according to claim 1, wherein,
    after the upper surface of the first surface electrode is flattened, a second surface electrode is formed on the upper surface of the first surface electrode.

4. The method of manufacturing the semiconductor device according to claim 3, wherein,
    after the second surface electrode is formed, a third surface electrode consisting of Au is formed on an upper surface of the second surface electrode by plating treatment.

5. The method of manufacturing the semiconductor device according to claim 3, wherein
    the first surface electrode is Ni, and
    the second surface electrode contains Ni.

6. The method of manufacturing the semiconductor device according to claim 3, wherein
    the first surface electrode is Cu, and
    the second surface electrode contains Cu.

7. The method of manufacturing the semiconductor device according to claim 1, wherein
    the first surface electrode contains Al.

* * * * *